United States Patent
Fan

(10) Patent No.: US 9,070,722 B2
(45) Date of Patent: Jun. 30, 2015

(54) SYSTEM AND METHOD FOR THE SONIC-ASSISTED CLEANING OF SUBSTRATES UTILIZING A SONIC-TREATED LIQUID

(75) Inventor: Yan Fan, San Diego, CA (US)

(73) Assignee: AKRION SYSTEMS, LLC

( * ) Notice: Subject to any disclaimer, the term of this patent is extended or adjusted under 35 U.S.C. 154(b) by 1485 days.

(21) Appl. No.: 12/445,783

(22) PCT Filed: Oct. 17, 2007

(86) PCT No.: PCT/US2007/081648
§ 371 (c)(1),
(2), (4) Date: Oct. 5, 2010

(87) PCT Pub. No.: WO2008/070295
PCT Pub. Date: Jun. 12, 2008

(65) Prior Publication Data
US 2011/0041871 A1    Feb. 24, 2011

Related U.S. Application Data

(60) Provisional application No. 60/852,341, filed on Oct. 17, 2006, provisional application No. 60/854,031, filed on Oct. 24, 2006.

(51) Int. Cl.
*B08B 7/00* (2006.01)
*B08B 7/04* (2006.01)
*B08B 3/00* (2006.01)
*B08B 3/12* (2006.01)
*H01L 21/67* (2006.01)

(52) U.S. Cl.
CPC ............ *H01L 21/67051* (2013.01); *B08B 3/12* (2013.01)

(58) Field of Classification Search
CPC ............................ H01L 21/67051; B08B 3/12
USPC .............................. 134/1, 1.3, 26, 32, 33, 902
See application file for complete search history.

(56) References Cited

U.S. PATENT DOCUMENTS

| 5,964,954 | A  |   | 10/1999 | Matsukawa et al. |
|-----------|----|---|---------|------------------|
| 6,039,055 | A  | * | 3/2000  | Akatsu ............... 134/1.3 |
| 6,039,309 | A  | * | 3/2000  | Kuklinski ............ 261/1 |
| 6,848,455 | B1 | * | 2/2005  | Shrinivasan et al. ....... 134/1.3 |
| 7,238,085 | B2 | * | 7/2007  | Montierth et al. ........... 451/36 |
| 7,334,588 | B2 | * | 2/2008  | Verhaverbeke et al. ...... 134/148 |
| 7,451,774 | B2 | * | 11/2008 | Verhaverbeke et al. ...... 134/184 |
| 7,784,478 | B2 | * | 8/2010  | Fani et al. .................... 134/174 |
| 7,819,985 | B2 | * | 10/2010 | Verhaverbeke et al. ........ 134/33 |
| 7,836,901 | B2 | * | 11/2010 | Verhaverbeke et al. ...... 134/184 |
| 2002/0029788 | A1 | * | 3/2002 | Verhaverbeke et al. ........ 134/1.3 |
| 2003/0015216 | A1 | * | 1/2003 | Nicolosi et al. ................ 134/1.3 |
| 2004/0069319 | A1 |   | 4/2004 | Boyd et al. |
| 2004/0134514 | A1 | * | 7/2004 | Wu et al. .......................... 134/1 |
| 2004/0163682 | A1 |   | 8/2004 | Boyd et al. |
| 2005/0003737 | A1 | * | 1/2005 | Montierth et al. ................ 451/5 |

(Continued)

*Primary Examiner* — Alexander Markoff
(74) *Attorney, Agent, or Firm* — The Belles Group, P.C.

(57) ABSTRACT

The present invention is directed to sonic-assisted systems mid methods of processing of substrates utilizing a sonic-treated liquid. In one embodiment, the sonic-treated liquid can be created by subjecting a desired processing liquid to sonic energy generated by a first sonic energy source prior to being applied So the substrate, The sonic-treated liquid is applied to the substrate where a second source of sonic energy applies sonic energy to the substrate. The sonic-treated liquid can be used as the coupling fluid between the second source of sonic energy and the substrate.

16 Claims, 7 Drawing Sheets

FIG. 1

(56) References Cited

U.S. PATENT DOCUMENTS

| | | |
|---|---|---|
| 2005/0087209 A1 | 4/2005 | Nicolosi, Jr. et al. |
| 2005/0284509 A1* | 12/2005 | Sakurai et al. ............... 134/184 |
| 2006/0060991 A1* | 3/2006 | Holsteyns et al. .............. 261/81 |
| 2006/0130871 A1* | 6/2006 | Hwang et al. .................... 134/1 |
| 2009/0090381 A1* | 4/2009 | Li et al. ............................ 134/1 |

\* cited by examiner

SYSTEM AND METHOD FOR THE SONIC-ASSISTED CLEANING OF SUBSTRATES UTILIZING A SONIC-TREATED LIQUID

CROSS REFERENCE TO RELATED APPLICATIONS

The present application is a National Stage entry of International Application No. PCT/US2007/81648, filed on Oct. 17, 2007, which claims the benefit of U.S. Provisional Application Serial No. 60/852,341, filed on Oct. 17, 2006, and U.S. Provisional Application No. 60/854,031, filed on Oct. 24, 2006, the entireties of which are hereby incorporated by reference.

FIELD OF THE INVENTION

The present invention relates generally to the field of processing substrates, and specifically to methods and systems for cleaning semiconductor wafers utilizing sonic/acoustic energy. The invention is not limited to semiconductor wafers can be used for any substrates that require high levels of cleanliness and/or otherwise benefit from sonic-assisted processing.

BACKGROUND OF THE INVENTION

In the field of semiconductor manufacturing, it has been recognized since the beginning of the industry that removing particles from semiconductor wafers during the manufacturing process is a critical requirement to producing quality profitable wafers. While many different systems and methods have been developed over the years to remove particles from semiconductor wafers, many of these systems and methods are undesirable because they damage the wafers. Thus, the removal of particles from wafers, which is often measured in terms of the particle removal efficiency ("PRE"), must be balanced against the amount of damage caused to the wafers by the cleaning method and/or system. It is therefore desirable for a cleaning method or system to be able to break particles free from the delicate semiconductor wafer without resulting in damage to the devices on the wafer surface.

Existing techniques for freeing the particles from the surface of a semiconductor wafer utilize a combination of chemical and mechanical processes. One typical cleaning chemistry used in the art is standard clean 1 ("SC1"), which is a mixture of ammonium hydroxide, hydrogen peroxide, and water. SC1 oxidizes and etches the surface of the wafer. This etching process, known as undercutting, reduces the physical contact area of the wafer surface to which the particle is bound, thus facilitating ease of removal. However, a mechanical process is still required to actually remove the particle from the wafer surface.

For larger particles and for larger devices, scrubbers have historically been used to physically brush the particle off the surface of the wafer. However, as device sizes shrank in size, scrubbers and other forms of physical cleaning became inadequate because their physical contact with the wafers began to cause catastrophic damage to the smaller/miniaturized devices.

Recently, the application of sonic/acoustic energy to the wafers during chemical processing has replaced physical scrubbing to effectuate particle removal. The sonic energy used in substrate processing is generated via a source of sonic energy, which typically comprises a transducer which is made of piezoelectric crystal. In operation, the transducer is coupled to a power source (i.e. a source of electrical energy). An electrical energy signal (i.e. electricity) is supplied to the transducer. The transducer converts this electrical energy signal into vibrational mechanical energy (i.e. sonic/acoustic energy) which is then transmitted to the substrate(s) being processed. Characteristics of the electrical energy signal supplied to the transducer from the power source dictate the characteristics of the sonic energy generated by the transducer. For example, increasing the frequency and/or power of the electrical energy signal will increase the frequency and/or power of the sonic energy being generated by the transducer.

The relationship between the power level of the sonic energy and particle removal is well known. In essence, higher sonic energy power levels are more effective at removing particles, thus generally resulting in increased PRE. Today, sonic system designs focus on the higher sonic energy power to increase their cleaning effectiveness. Sonic energy has proven to be an effective way to remove particles, but as with any mechanical process, damage is possible and sonic cleaning is faced with the same damage issues as traditional physical cleaning methods and apparatus.

Thus, sonic energy equipment suppliers are constantly trying to balance the desire to achieve high PRE (which is achieved with high power sonic energy) with the desire to minimize damage (which is a side-effect of high power sonic energy). To improve cleaning and to reduce damage caused to wafers by the application of sonic energy, some suppliers have implemented some solutions that control the frequency of the sonic energy, the amplitude of the sonic energy, and/or the angles at which the sonic energy is applied to the wafers. However, even with these controls, damage is still occurring and/or less than optimal PRE is being achieved. Therefore, a need still exists for sonic energy processing equipment and methods that achieve high PRE while minimizing device damage.

SUMMARY OF THE INVENTION

It is therefore an object of the present invention to provide a system and method of processing and/or cleaning substrates using sonic energy.

Another object of the present invention is to provide a system and method of processing and/or cleaning substrates using sonic energy that reduces and/or eliminates damage to devices on the substrates.

A further object of the present invention is to provide a system and method of processing and/or cleaning semiconductor wafers that reduces and/or eliminates damage to devices on the wafers while achieving improved levels of PRE.

Yet another object of the present invention to provide a system and method of processing and/or cleaning substrates using sonic energy that utilizes ex situ bubble generation in the coupling fluid.

A further object of the present invention is to provide a system and method of processing and/or cleaning substrates using sonic energy that controls cavitations within the coupling fluid.

A still further object of the present invention is to provide a system and method of processing and/or cleaning substrates using sonic energy that increases the device yield.

A yet further object is to provide a system and method of processing and/or cleaning substrates with sonic energy that controls the size of bubbles present in the coupling fluid.

Another object is to provide a system and method of processing substrates that improves processing efficiency and/or particle removal.

These and other objects are met by the present invention, which is a method and/or system for processing substrates that creates and/or utilizes a liquid that has been subjected to a field of sonic energy prior to being applied to the substrate (i.e., "a sonic-treated liquid"). As used herein, a liquid includes without limitation solutions, chemicals, diluted chemicals, chemical mixtures, water, combination thereof and any other processing fluid that comprises a liquid component.

In one aspect, the sonic-treated liquid can be formed by a first field of sonic energy and then applied to the surface of a substrate where it is subjected to a second field of sonic energy. The first field of sonic energy preferably causes cavitations within the liquid. By cavitating the liquid with the first sonic energy field, the sonic-treated liquid is more susceptible to subsequent cavitations when subjected to the second sonic energy field. The second sonic energy field can cause cavitations within the sonic-treated liquid at lower power levels than had the liquid not been previously cavitated by the first sonic energy field. Therefore, when utilized for cleaning, high PRE can be achieved by the resulting cavitations forces on the surface of the substrate without having to subject the substrate surface to the traditional higher power levels thought necessary to achieve cavitations. As a result, damage to the substrate is reduced.

Because the first field of sonic energy is not applied to the substrate, any desired power level and/or frequency can be used to cavitate the liquid without a concern of damaging the substrate.

By cavitating the liquid with the first sonic energy field prior to the liquid being applied to the substrate, ex-situ bubble generation is induced within the liquid. The size and amount of the ex-situ bubbles present in the sonic-treated liquid can be controlled by adjusting the frequency and/or power of the first sonic energy field as desired. To the extent that bubbles may already exist in the liquid as a result of dissolved gases and/or pressure drops in the liquid, the first field of sonic energy will also regulate the size of these pre-existing bubbles in a similar manner. Controlling the size and/or amounts of bubbles present in the sonic-treated liquid that is applied to the substrate facilitates more controlled and predictable cavitations when exposed to the second field of sonic energy. This is desirable for a multitude of reasons.

In one embodiment, the invention can be a system for processing substrates comprising: a support for supporting a substrate; a vibration transmitter positioned close to and spaced from a surface of a substrate on the support; a dispenser for providing a liquid between a portion of the vibration transmitter and a surface of a substrate on the support; a first source of sonic for applying sonic energy to the liquid prior to the liquid being provided between the vibration transmitter and the surface of the substrate; and a second source of sonic energy operably coupled to the vibration transmitter.

In another embodiment, the invention can be a system for processing substrates comprising: a support for supporting a substrate; a first sonic energy source for applying sonic energy to a liquid, thereby creating a sonic-treated liquid; a second source of sonic energy positioned close to and spaced from a surface of a substrate on the support; and means for applying the sonic-treated liquid to a surface of a substrate on the support.

In yet another embodiment, the invention can be a method of processing a substrate comprising: a) supporting a substrate having a surface; b) applying sonic energy via a first sonic energy source to a liquid, thereby creating a sonic-treated liquid; c) providing a vibration transmitter close to and spaced from the surface of the substrate, the vibration transmitter acoustically coupled to a second sonic energy source; and d) supplying the sonic-treated liquid to the surface of the substrate.

In still another embodiment, the invention can be a method of cleaning a substrate comprising: a) supporting a substrate having a surface in a substantially horizontal orientation; b) rotating the substrate; c) applying sonic energy via a first sonic energy source to a liquid, thereby creating a sonic-treated liquid; d) providing a vibration transmitter close to and spaced from the surface of the substrate, the vibration transmitter acoustically coupled to a second source of sonic energy; e) supplying the sonic-treated liquid to the surface of the substrate; and f) applying sonic energy generated by the second sonic energy source through the sonic-treated liquid and to the surface of the substrate.

In yet another embodiment, the invention can be a method of cleaning a substrate comprising: a) supporting a substrate having a surface in a substantially horizontal orientation; b) rotating the substrate; c) providing a vibration transmitter close to and spaced from the surface of the substrate, the vibration transmitter acoustically coupled to a source of sonic energy; d) applying a first liquid to a surface of the substrate so as to form a layer of the first liquid on the surface of the substrate, the vibration transmitter being in contact with the layer of the first liquid; and e) flowing a second liquid onto the vibration transmitter in manner so that the second liquid flows off the vibration transmitter and into the layer of the first liquid.

In another embodiment, the invention can be a system for processing substrates comprising: a rotatable support for supporting and rotating a substrate; a vibration transmitter positioned so that at least a portion of the transmitter is adjacent to a surface of a substrate on the support; a first dispenser for applying a liquid to the surface of the substrate on the support so as to form a film of liquid on the surface of the substrate that couples the portion of the transmitter to the surface of the substrate; a first source of sonic energy for applying sonic energy to the liquid prior to the liquid being applied to the surface of the substrate; and a second source of sonic energy operably coupled to the vibration transmitter.

In another embodiment, the invention can be a method of cleaning a substrate comprising: a) supporting a substrate having a surface in a substantially horizontal orientation; b) rotating the substrate about a rotational axis; c) providing a vibration transmitter adjacent the surface of the substrate, the vibration transmitter acoustically coupled to a source of sonic energy; d) applying a first liquid to a surface of the substrate so as to form a layer of the first liquid on the surface of the substrate, the vibration transmitter being in contact with the layer of the first liquid; and e) flowing a second liquid onto the vibration transmitter in manner so that the second liquid flows off the vibration transmitter and into the layer of the first liquid.

In another aspect, the sonic-treated liquid can be formed by directly applying a processing liquid to the source of sonic energy that is also applying the sonic energy to the substrate.

In other aspects, the invention can be a megasonic cleaning system and method that utilizes a liquid that is exposed to a sonic energy field/source prior to being applied to the surface of a substrate where it acts as the coupling layer between the surface of the substrate and the transmitter. By causing cavitations in the liquid prior to being applied to the surface of the wafer, the size of the bubbles in the liquid that is eventually applied to the wafer can be controlled, thereby controlling the cavitations events that occur on the surface. Thus, damage can be minimized.

DETAILED DESCRIPTION OF THE DRAWINGS

Figure 1:
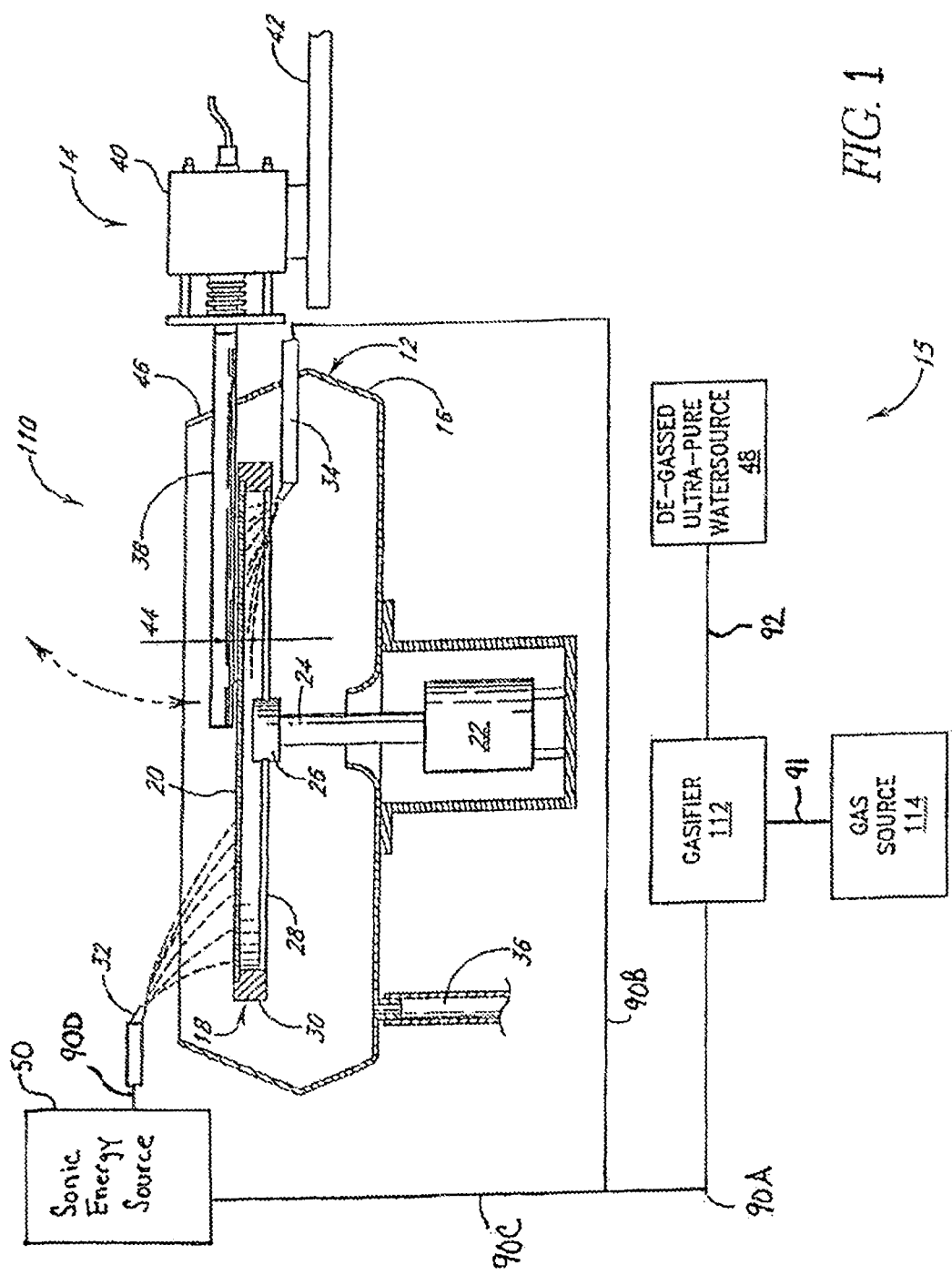
FIG. 1 is a schematic of a megasonic cleaning system according to one embodiment of the present invention.

Referring to FIG. 1 a megasonic cleaning system 110 according to one embodiment of the present invention is illustrated. The megasonic cleaning system 110 generally comprises a process chamber 12, a first source of sonic energy 50, a second source of sonic energy 14 (which is in the embodiment of a rod-like probe assembly), (schematically illustrated) and a liquid supply system 15. While the system and methods of the present invention are exemplified as a single-wafer non-immersion system, the invention is not so limited. Those skilled in the art will appreciate that the concepts and ideas discussed herein can be incorporated into other styles of sonic cleaning systems, including batch systems, immersion systems, and the like. Additionally, the concepts and ideas discussed herein can be incorporated into other styles of single-wafer sonic cleaning systems, including systems that use a plate-like transducer assembly, a lens style transducer assembly, or a pie-shaped transducer assembly. Such transducer assemblies and single-wafer cleaning systems are disclosed, for example in U.S. Pat. No. 6,539,952 to Itkowitz, issued Apr. 1, 2003; U.S. Pat. No. 6,791,242 to Beck et al., issued Sep. 14, 2004; and United States Patent Application Publication 2002/0029788 to Verhaverbeke et al., published Mar. 14, 2002, the entireties of which are hereby incorporated by reference.

The process chamber 12 of the megasonic cleaning system 110 is made up of a tank 16 inside of which is disposed a support 18 adapted to support and/or securely hold a substrate 20, which may be a semiconductor wafer or other similar item that requires a high level of cleanliness. The process chamber 12 comprises supports the substrate 20 in a gaseous atmosphere, such as air, nitrogen, or other gases. As used herein, the term process chamber 12 is any volume of space in which a substrate 20 can be processed; it does not require any specific wall arrangement and/or structural arrangement.

The support 18 generally comprises a motor 22, shaft 24, hub 26, spokes 28, and an annular rim 30. The rim 30 supports the substrate 20 in a substantially horizontal orientation as it is rotated about a generally vertical axis by the motor 22, in cooperation with the shaft, hub, spokes, etc. Upper and/or lower dispensers or nozzles 32, 34 are positioned to dispense a liquid onto the upper and/or lower surfaces of the substrate 20, thereby forming a layer of the liquid on the top and bottom surfaces of the substrate 20. The dispensers 32, 34 can apply the cleaning solution to the substrate 20 via a laminar or turbulent fluid flow or a spraying action. The dispensers 32, 34 can be nozzles, sprayers, etc. of any type well known in the art. A drain line 36 in the lower end of the tank 16 permits accumulated cleaning solution to exit therefrom.

The second sonic energy source 14 comprises a rod-like transmitter 38 which is acoustically coupled to one or more transducers (not shown) inside of a housing 40. The transducers are preferably piezoelectric crystals adapted to convert electrical energy into sonic energy. Preferably, the sonic energy generated by the second sonic energy source 14 is in the megasonic frequency range. Of course other frequency ranges can be utilized as desired. The transducers within the housing 40 are acoustically coupled to the transmitter 38 so that sonic energy generated by the transducers is transmitted into and by the transmitter 38 to a desired location, which in this case is to the substrate 20.

The housing 40 is mounted to a support member 42 so that the shaft of the transmitter 38 extends generally parallel to the surface of the substrate 20 and is separated therefrom by a narrow gap 44. More specifically, the rod-like transmitter 38 comprises an elongate bottom edge that is separated from the substrate by the narrow gap 44. In other embodiments of transmitters, such as the pie-shaped transducer assembly of U.S. Pat. No. 6,791,242, the elongate edge is the perimeter edges of the pie shaped transmitter plate that extend over the wafer surface.

The support member 42, along with the transmitter 38, is retractable or rotatable upward to allow insertion/removal of substrates to the support 18. A slot 46 is provided in the tank 16 to permit rotational movement of the transmitter 38 in and out of the tank. The exemplified transmitter 38 is an elongate probe preferably made of quartz, sapphire, or boron nitride. The invention, however, is not limited to any specific type of transmitter shape or material of construction. As discussed above, the transmitter can take on a wide variety of shapes and configurations, such as, without limitation, a flat plate, a disk, a pie-shaped structure, a curved lens, etc. The transmitter can also be constructed of a wide variety of materials and/or combination of materials.

During general operation of the megasonic cleaning system 100, high-frequency electrical power is supplied to the megasonic transducer, which vibrates at a high, megasonic frequency. If desired, ultrasonic or other frequencies can be used. This vibration is transmitted to the transmitter 38, which also vibrates at a corresponding megasonic frequency. The megasonic vibration of the transmitter 38 agitates a layer of liquid 60 on the substrate 20, creating a cleaning action on the surface of the substrate 20. In other words, the transmitter subject 38 subjects the layer of liquid 60 in the area beneath the transmitter 38 to a first field of megasonic energy.

Where the lower nozzle 34 is also employed to provide the cleaning solution on the lower surface of the substrate 20, this lower-surface liquid is also agitated in the areas nearest the probe. As the substrate rotates under the probe, substantially the entire surface of the substrate is exposed to the cleaning action generated by the probe and agitated liquid. Additional details pertaining to the megasonic cleaning system 110 may be found in U.S. Pat. No. 6,140,744, issued Oct. 31, 2000 and entitled WAFER CLEANING SYSTEM, the entirety of which is hereby incorporated by reference.

As discussed in the background section of this document, the application of megasonic energy from the transmitter 38 to the surface of a substrate can damage the substrate 20, in addition to cleaning it. This damage problem is especially critical when the substrate is a semiconductor wafer having devices thereon. For example, a semiconductor wafer with a topography of technology nodes, such as gate structures, trenches, and metal lines, with a width at or below 100 nm is especially vulnerable to damage during sonic cleaning processes. The present invention addresses the issues of device damage while maintaining acceptable PRE by utilizing a specially designed liquid supply system 15 to supply a sonic-treated liquid to the wafer 20.

The liquid supply system 15 comprises a gasifier 112, a gas source 114, a liquid source 48, a liquid supply line 90 (comprising sections 90A-90D) and a first source of sonic energy 50. All components of the liquid supply system are operatively and fluidly coupled to each other and to the dispensers 32, 34. While not illustrated, the necessary valves, pumps, sensors, etc. are incorporated into the liquid supply system 15. A detailed explanation of these components is not necessary, as this knowledge is well within the level of those ordinarily skilled in the art.

The liquid supply system 15 (i.e., its components) are operably connected to and controlled by a system controller (not illustrated). The controller will control and regulate the flow of liquid for the megasonic cleaning system 110 through operable and electrical connections to the pumps, valves, sensors, etc. The controller can be a suitable microprocessor based programmable logic controller, personal computer, or the like for process control. The controller preferably includes various input/output ports used to provide connections to the various components of the megasonic cleaning system 110 that need to be controlled and/or communicated with. The electrical connections between the controller and the liquid supply system's components are provided as necessary. The controller also preferably comprises sufficient memory to store process recipes and other data, such as thresholds inputted by an operator, processing times, processing conditions, processing temperatures, flow rates, desired concentrations, sequence operations, and the like. The controller can communicate with the various components of the liquid supply system 15 to automatically adjust and maintain process conditions, such as the temperature of the liquid, flow rates, application of sonic energy, etc. The type of system controller used for any given system will depend on the exact needs of the system in which it is incorporated.

The gas source 114 and the liquid source 48 are operatively and fluidly coupled to the gasifier 112 via gas line 91 and liquid line 92 respectively. As necessary, the gasifier 112 injects or dissolves the gas into the liquid, thereby forming a cleaning liquid. The invention is not limited to any specific gas, liquid or combination thereof. Examples of suitable gases include, without limitation, $NH_3$, $N_2$, $O_2$, He, Ar, air, $CO_2$, $O_3$ and the like. The gas can be any reactive gas, non-reactive gas, or combinations thereof. Examples of suitable liquids include, without limitation, deionized water, SC1, SC2, TMAH, oxalic acid, acetic acid, organic solvents, and combinations and diluted versions thereof. The exact liquid and/or gas used will depend on the cleaning process being performed, the type of substrate being processed, the size of the devices on the substrate, and the susceptibility of the devices to damage. In some embodiments, a gas will not be added to the liquid. In other embodiments, the liquid supply system 15 can be adapted to mix multiple liquids for supply to the wafer 20 as a liquid mixture.

The gasifier 112 may comprise any conventional gas injection or mixing device, such as a membrane contactor. Alternatively, the gasifier 112 may comprise any chamber or reservoir which facilitates exposure of the liquid to the desired gas for a sufficient time to allow the gas to dissolve in the liquid. In one embodiment, the liquid is exposed to the gas until equilibrium is reached for the operating pressure and temperature of the gasifier 112. In another embodiment, the gasifier 112 exposes the liquid to air or other gas(es) at ambient conditions; i.e. room temperature and pressure. It should be noted that the invention is not limited by the presence of the gasifier 112 or the gas source 114. In some embodiments of the invention, the cleaning liquid will not be made "on the fly" during substrate processing. Instead, the cleaning liquid may be pre-made and stored in an auxiliary tank or otherwise provided from a reservoir.

Once the cleaning liquid is produced/provided, it flows into supply line section 90A. At this point, the cleaning liquid flows into supply line section 90C for subsequent application to the top surface of the wafer 20 via the dispenser 32 as a sonic-treated liquid. If desired, the cleaning liquid can also be flowed into supply line section 90B for application to the bottom surface of the wafer 20 via the dispenser 34.

As the cleaning liquid flows from its source to the dispenser 32, it passes through the first source of sonic energy 50. As the cleaning liquid passes through the first sonic energy source 50, it is subjected to a first field of sonic energy, thereby converting the cleaning liquid into a sonic-treated liquid. As used herein, the term "sonic-treated liquid" is a liquid that has been exposed to sonic/acoustic energy. The sonic-treated liquid created in the first sonic energy source 50 is then supplied to the top surface of the wafer 20 via the dispenser 32. The first sonic energy source 50 is preferably located at or near the dispenser 32 that applies the sonic-treated liquid to the wafer 20.

The first sonic energy source 50 can take on a wide variety of embodiments, so long as it is capable of applying sonic/acoustic energy to the cleaning liquid. For example, the first sonic energy source 50 can be small tank and/or trough having one or more transducers acoustically coupled to the liquid as it passes through the tank. In another embodiment, the first sonic energy source 50 can be one or more transducers that are acoustically coupled to the liquid supply line 90C through a proper bonding process. In still another embodiment, the first sonic energy source 50 can comprise a liquid conduit wherein at least a portion of the conduit is constructed of a material that transmits sonic energy, including without limitation quartz, boron nitride, Teflon, metals, plastics, alloys, etc. In this embodiment, one or more transducers may be acoustically coupled to the transmissive portion of the conduit so that when operated, acoustic energy will transmitted into the liquid as it passes therethrough. Many other embodiments of the first sonic energy source 50 will exist. The invention is not limited to any particular structure for the first sonic energy source 50, it is only necessary that sonic energy be applied to the liquid.

Figure 7:
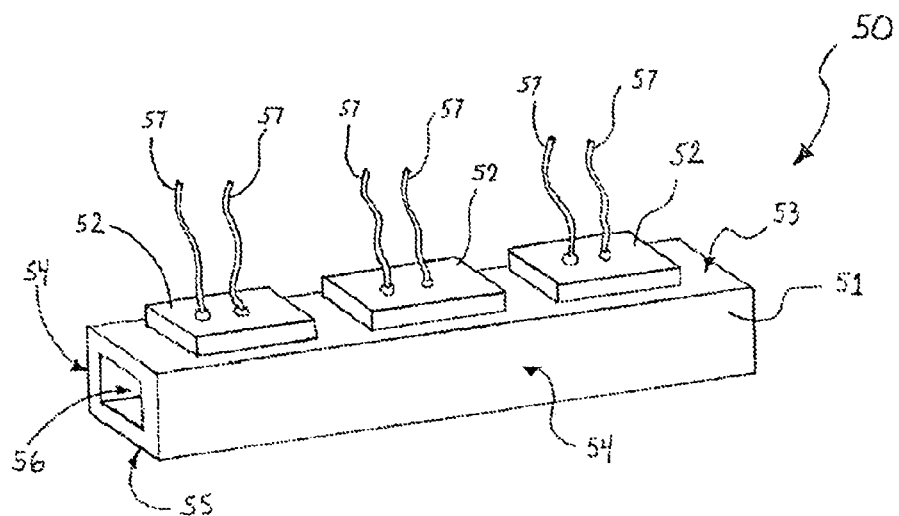
FIG. 7 is a schematic of a first sonic energy source according to one embodiment of the present invention.

Referring now to FIG. 7, the structure of one embodiment of the first sonic energy source 50 will be described. The first sonic energy source 50 comprises a conduit section 51 and plurality of transducers 52. Three transducers 52 are illustrated. However, a single or any number of transducers 52 can be utilized.

The conduit section 51 is a hollow tubular member having an internal cavity 56 extending axially through its length. The cavity 56 acts as a passageway so that liquid can be flowed through the length of the conduit section 51. The conduit section 51 has a generally square cross-sectional profile. However, any desired cross-sectional profile can be used, such as circular, rectangular, triangular, etc. It is also possible for the cavity 56 to have a vertical cross-sectional profile that is different than that of the conduit section 51.

It is preferred that the conduit section 51 be constructed of a material transmits sonic energy and does not contaminate the cleaning liquid that passes through its cavity 56. Acceptable materials included without limitation, quartz, sapphire, boron nitride, vitreous carbon, metals, alloys, Teflon, plastics and combinations thereof. In some embodiments, the conduit section 51 may merely be a section of the standard liquid supply line 90. In other embodiments, it the conduit section 51 may be a separate structure that is in fluid coupling with the standard liquid supply line 90.

The transducers 52 are acoustically coupled to the conduit section 51 so that sonic energy generated by the transducers 52 can be transmitted through the walls of the conduit section 51 and into any liquid that is flowing through the cavity 56. Of course, intervening layers, such as adhesion layers, transmission layers and wetting layers can be used as desired to achieve the acoustic coupling. The transducers 52 are bonded to the top surface 53 of the conduit section 51. However, the transducers 52 can be located on any surface of the conduit section 51 and/or in any arrangement. For example, all of the transducers 52 can be located on the side surfaces 54 or the bottom surface 55 of the conduit section 51. Alternatively, the transducers 52 can be located on multiple surfaces of the conduit section 51, such as two transducers 52 on the bottom surface 55 and one transducer 52 on the top surface 53. In such an arrangement, it may be preferable to stagger the transducers 52 so that the individual sonic energy field generated by each transducer 52 does not interfere with the sonic energy field generated by another one of the transducers 52.

Each of the transducers 52 are operably connected to a source of electrical energy, such as a signal generator and the associate equipment, via electrical connections 57. The transducers 52 can be piezoelectric crystals or other materials that will resonate when supplied with the electricity signal, thereby converting the electrical energy into corresponding sonic energy.

Referring back to FIG. 1, the operation of the megasonic cleaning system 110 according one embodiment of the present invention will be generally described. While the steps of the method will be described in a particular order for clarity, it is to be understood that many of the steps discussed herein can be performed at different times and/or in different sequences. Furthermore, while the cleaning method will be described in relation to the megasonic cleaning system 110 of FIG. 1 for ease of reference and understanding, the inventive method is not so limited and can be carried out on a host of cleaning systems.

Initially, the megasonic cleaning system 110 is provided. A semiconductor wafer 20 is positioned on the support 18 in a horizontal orientation. The semiconductor wafer 20 comprises a surface having topography with technology nodes having a width of 100 nanometers or less. The semiconductor wafer 20 is positioned on the support 18 so that the surface having the technology nodes is facing the transmitter 38 of the second sonic energy source 14 (i.e., in this case upward).

The support 18 is then rotated via the motor 22 at a desired rotational speed (i.e., RPM), which in turn rotates the wafer 20 in a substantially horizontal plane. The appropriate pumps and/or valves are activated so that the desired flow rates of liquid and/or gas are flowed from the liquid and gas sources 48, 114, respectively and into the gasifier 112. The gasifier 112 creates a cleaning liquid by dissolving the gas into the liquid. In another embodiment, the cleaning liquid may not have gas added to it. The fluid flow characteristics of the liquid and gas supplies are controlled by the controller to create the cleaning liquid with desired concentrations.

The cleaning liquid exits the gasifier 112 via liquid supply line section 90A. The liquid supply line section 90A delivers the cleaning liquid to supply line section 90C (and possibly to supply line section 90B for concurrent application to the bottom surface of the wafer 20 via dispenser 34). The cleaning liquid that flows into the liquid supply line section 90C is delivered to the first sonic energy source 50.

Figure 8:
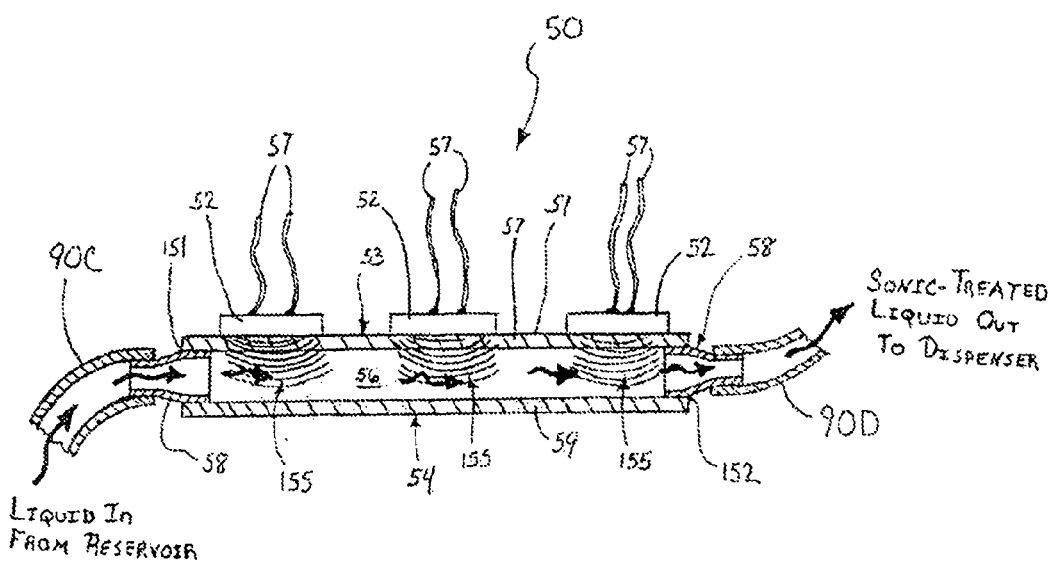
FIG. 8 is a schematic of a cleaning fluid passing through the first sonic energy source of FIG. 7.

Referring now to FIG. 8, the sonic treatment of the cleaning liquid as it passes through the first sonic energy source 50 will be described in detail with respect to the sonic energy source embodied in FIG. 7. The conduit section 51 of the first sonic energy source 50 is fluidly coupled at one end to liquid supply line section 90C and at the other end to liquid supply line section 90D. More specifically, a pair of couplings 58 are used to fluidly connect the internal cavity 56 of the conduit section 51 to the liquid supply line sections 90C-D. As a result, a passageway is formed through the cavity 56 of the conduit section between the liquid supply line section 90C and the liquid supply line section 90D so that liquid can flow through. While the structure of the first sonic energy source 50 can vary greatly from embodiment to embodiment, the basic functioning of the first sonic energy source 50 in relation to intended purpose in the megasonic cleaning system 110 is generally applicable to all embodiments.

The cleaning liquid flowing through liquid supply line section 90C enters the inlet opening 151 of the cavity 56 of the conduit section 51. The cleaning liquid proceeds to enter and flow through the cavity 56 (from left to right). At this time (or earlier), the transducers 52 are activated by the controller. The transducers 52 generate sonic energy 155 that is transmitted through the top wall 57 of the conduit section 51 and into the cleaning liquid within the cavity. As a result, the cleaning liquid is subjected to a first field of sonic energy.

Preferably, the transducers 52 are operated to generate the sonic energy 155 at a frequency, time and/or power level that causes cavitations within the cleaning liquid as it passes through the cavity 56. Because the sonic energy 155 does not contact the wafer 20, it can be applied at high power levels and/or frequencies without having to worry about damaging the wafer 20. Preferably, the sonic energy 155 megasonic energy, and more preferably has a frequency between 800 and 1100 kHz. The power level can be generated at a high power density, preferably greater than 20 Watts/cm$^2$ and more preferably greater than 50 Watts/cm$^2$. Additionally, to the extent that bubbles may exist in the cleaning liquid resulting from the dissolved gas content, the sonic energy 155 will regulate the size of such bubbles. The sonic-treated liquid exits the cavity 56 of the conduit section 51 via the outlet opening 152.

Referring back to FIG. 1, upon the sonic-treated liquid exiting the first sonic energy source 50, the sonic-treated liquid flows into the liquid supply line section 90D. The liquid supply line section 90D delivers the sonic-treated liquid to the dispenser 32. The sonic-treated liquid is applied to the top surface of the wafer 20 via the dispenser 32. As a result, a layer of the sonic-treated liquid is formed on the top surface of the wafer 20. If desired, a layer of the cleaning liquid can also be applied to the bottom surface of the wafer 20 via the nozzle 34.

Figure 2:
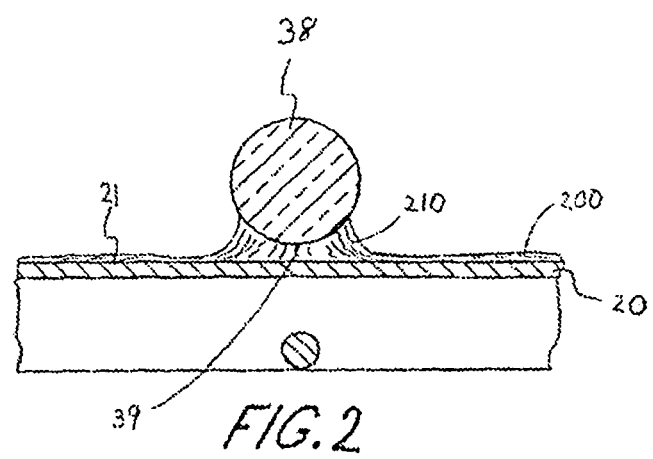
FIG. 2 is a schematic of the transmitter of the megasonic cleaning system of FIG. 1 positioned over a substrate.

Referring now to FIG. 2, the layer/film of the sonic-treated liquid 200 on the top surface 21 of the water 20 is in contact with and couples the transmitter 38 of the second sonic energy source 14 to the wafer 20. A meniscus 210 of the sonic-treated liquid is formed between the bottom elongate edge 39 of the transmitter 38 and the top surface 21 of the wafer 20. Once the layer of the sonic-treated liquid 200 is formed on the wafer 20, the transducer(s) of the second sonic energy source 14 is activated by the controller (or other sub-system controller). As a result the transducer of the second sonic energy source 14 creates sonic energy which is transmitted to the transmitter 38. The transmitter 38 transmits the sonic energy (which is preferably in the megasonic frequency range) through the layer of the sonic treated liquid and to the wafer 20 as a second field of sonic energy, thereby facilitating in the removal of particles and other contaminants from the wafer.

Because the sonic-treated liquid already underwent cavitations as a result of the first sonic energy field in the first sonic energy source 50, the sonic-treated liquid is more susceptible to cavitations when subjected to the second sonic energy field generated by the second sonic energy source 14. Thus, the second sonic energy field can cause cavitations within the sonic-treated liquid at a lower power level than had the cleaning liquid not been previously cavitated. In one embodiment, the second sonic energy source is preferably operated at a low power density in the range of 0.5 to 10 Watts/cm$^2$. Therefore, when utilized for cleaning, high PRE can be achieved by the cavitations forces on the surface of the wafer 20 without having to subject the wafer surface to the traditional higher power levels thought necessary to achieve cavitations. As a result, damage to the substrate is reduced.

Preferably, the sonic energy generated by the second source of sonic energy 14 is transmitted at a frequency between 800 and 1100 kHz, more preferably between 820 and 850 kHz, and most preferably about 841 kHz. The sonic energy is applied to the wafer 20 for a predetermined period of time, preferably less than 1 minute, and most preferably about 30 seconds.

While the megasonic cleaning system 110 of FIG. 1 utilizes the sonic-treated liquid to form the liquid coupling layer/film on the top surface of the wafer 20, the invention is not so limited. In some embodiments of the invention, it may be preferred to apply the sonic-treated liquid to the wafer 20 at a position that is at or near the transmitter so that the cavitations bubbles/voids within the sonic-treated liquid do not escape before the sonic-treated liquid is subjected to the sonic energy field generated by the second sonic energy source 14. In such an embodiment, it may be necessary to assist in the formation of the liquid coupling layer/film by utilizing a separate dispenser located in a different zone than the transmitter 38 of the second sonic energy source 14. An example of such an alternate embodiment of the system is illustrated in FIG. 3.

Figure 3:
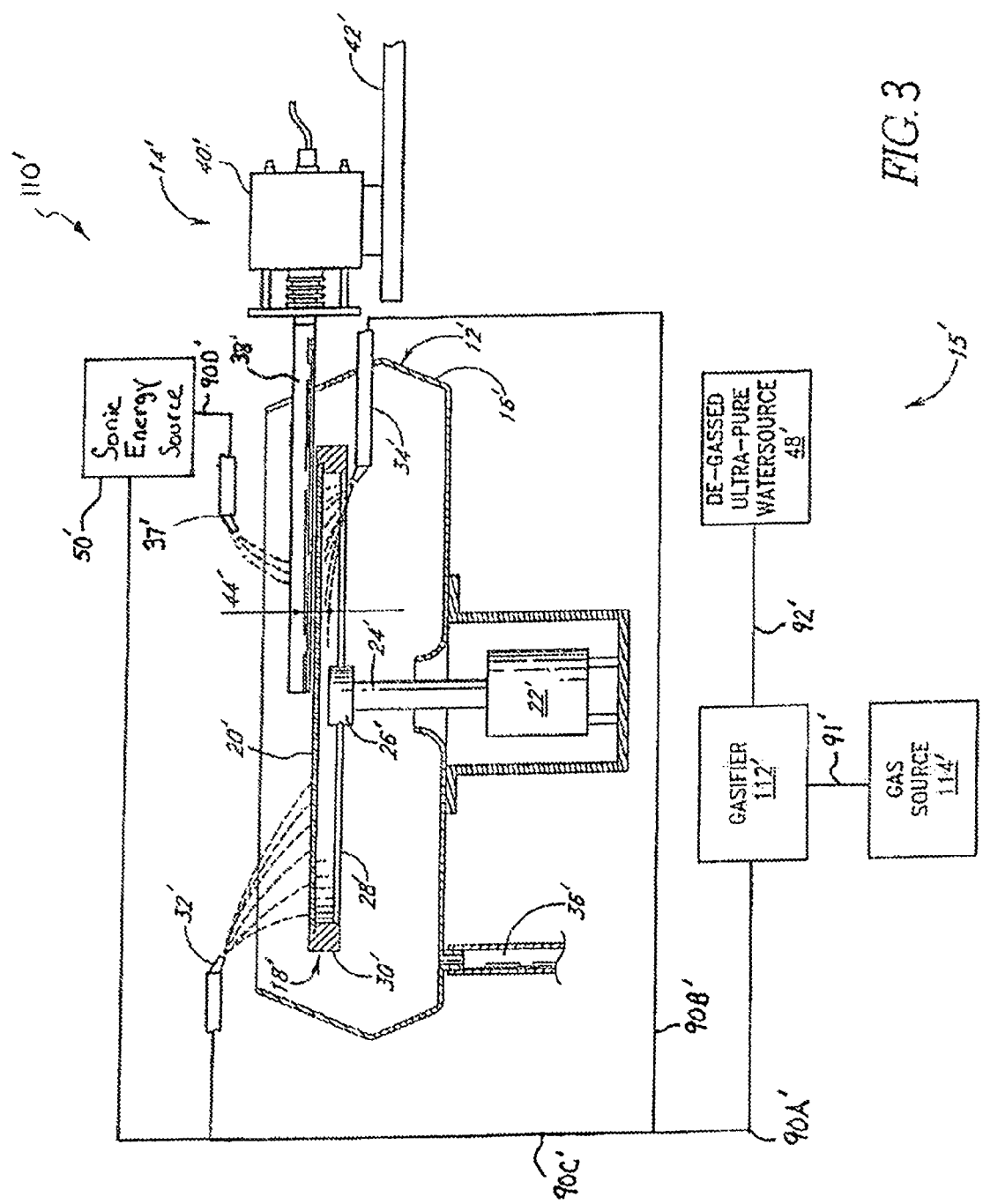
FIG. 3 is a schematic of a megasonic cleaning system according to a second embodiment of the present invention.
Figure 4:
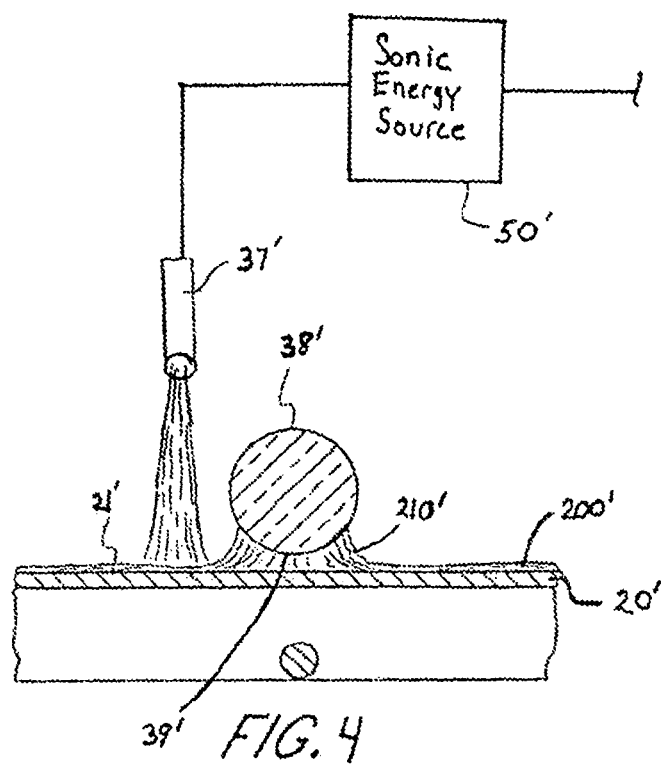
FIG. 4 is a schematic of the liquid dispenser and the transmitter of FIG. 3 positioned over a substrate.

Referring to FIGS. 3 and 4 concurrently, a megasonic cleaning system 110' is illustrated. The megasonic cleaning system 110' is similar to the megasonic cleaning system 110 of FIG. 1. Therefore, only those aspect of megasonic cleaning system 110' that are different than megasonic cleaning system 110 will be discussed. Like numbers are used to identify like parts.

In megasonic cleaning system 110', the dispenser 37' is adapted to provide the sonic-treated liquid to the wafer 20'. The dispenser 32' provides the cleaning liquid to the water to create the layer/film of liquid 200' on the top surface 21' of the wafer 20' that couples the transmitter 20' thereto. The dispenser 37' applies the sonic-treated liquid to the wafer 20' at a location that is close to the transmitter 38'. The dispenser 37' applies the liquid before the transmitter 38' so that the sonic-treated liquid becomes part of the meniscus 210' and subjected to the sonic energy field generated by the transmitter 38' soon after exiting the dispenser 37'. In one embodiment, it is preferred that the sonic-treated liquid be applied within 90 circumferential degrees of the transmitter's radial position. It should be noted that it may be possible to omit the dispenser 32' from the system 110' and use the sonic-treated liquid to form the liquid coupling layer/film despite its close proximity to the transmitter 38'.

Figure 5:
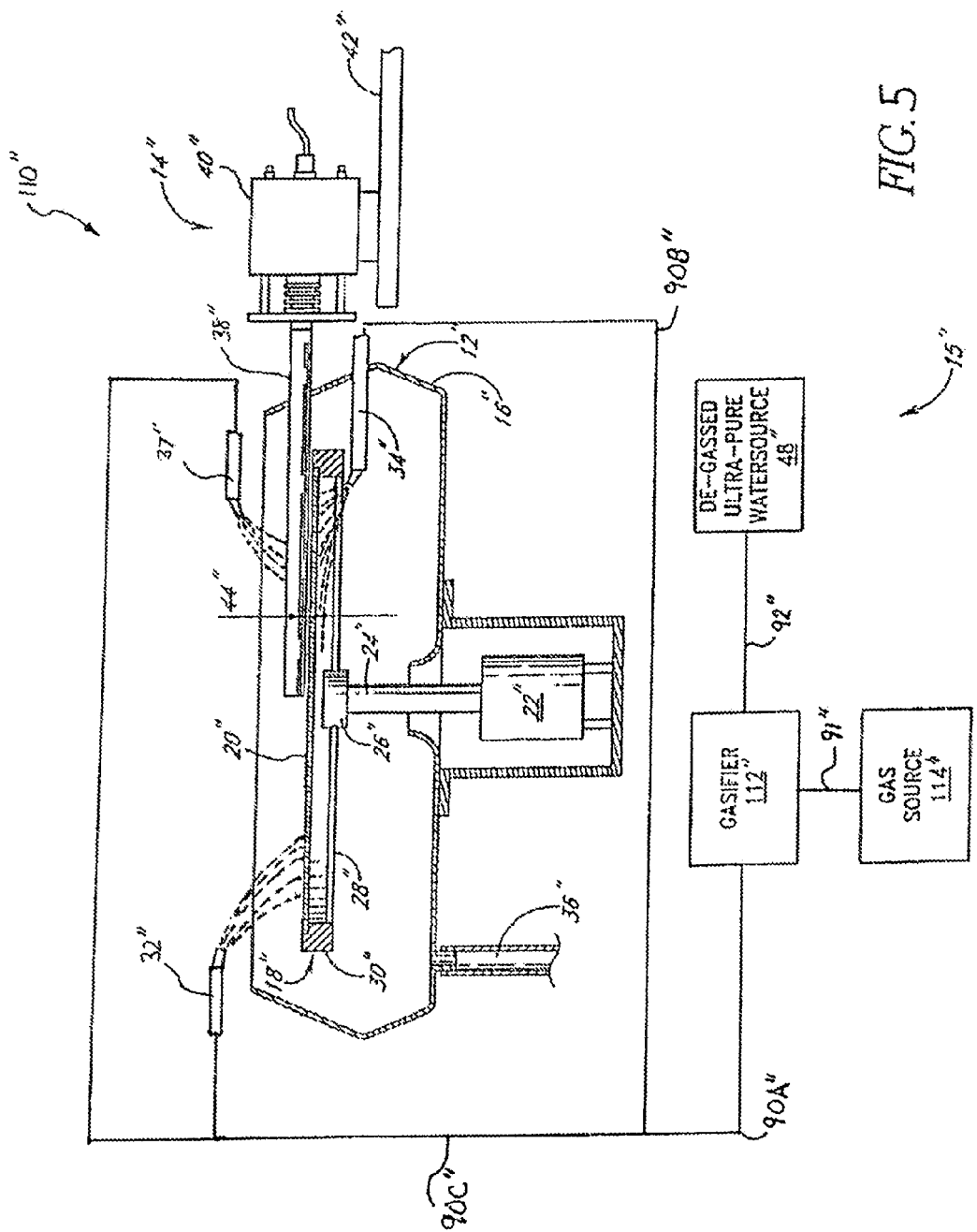
FIG. 5 is a schematic of a megasonic cleaning system according to a third embodiment of the present invention
Figure 6:
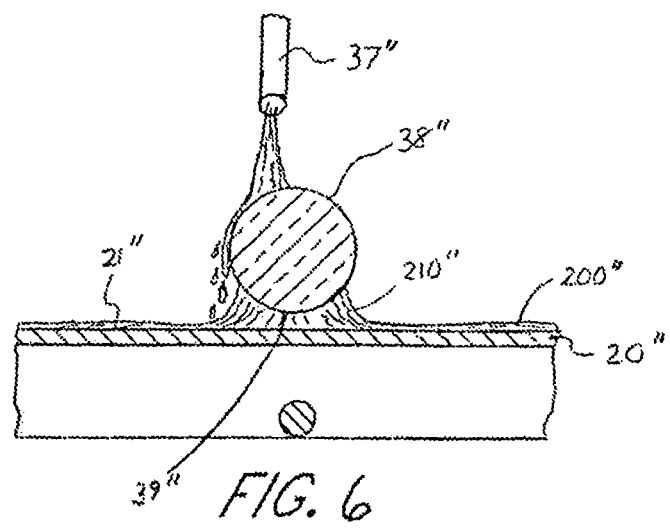
FIG. 6 is a schematic of the liquid dispenser and the transmitter of FIG. 5 positioned over a substrate.

Referring now to FIGS. 5 and 6 concurrently, a megasonic cleaning system 110" is illustrated according to a further embodiment of the invention. The general structure of megasonic cleaning system 110" is similar to the megasonic cleaning system 110 of FIG. 1. Therefore, only those aspect of megasonic cleaning system 110" that are different than megasonic cleaning system 110 will be discussed. Like numbers are used to identify like parts.

As with the other systems, the megasonic cleaning system 110" is designed to expose the cleaning liquid to sonic energy prior to being applied to the top surface 21" of the wafer 20". However, rather than utilize two separate sonic energy sources as is the case with the systems 110 and 110', the megasonic cleaning system 110" only utilizes the sonic energy generated by the sonic energy source 14". More specifically, the dispenser 37" is positioned so that the cleaning liquid is applied directly to the transmitter 38" in a manner that results in the cleaning liquid spilling off the transmitter 38" and into the layer/film of liquid 200" (and eventually into the meniscus 210") that couples the transmitter 38" to the wafer 20".

As a result, the sonic energy generated by the sonic energy source 14" is applied to the cleaning liquid when it comes into contact with the transmitter 38", thereby creating a sonic-treated liquid. The sonic-treated liquid, which is more susceptible to cavitations, runs off the side of the transmitter 38" and onto the wafer 20" where it is again subjected to the sonic energy field generated by the sonic energy source 14" as it passes under the transmitter 38".

The foregoing description of the preferred embodiment of the invention has been presented for the purpose of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A method of processing a substrate comprising:
   a) supporting a substrate having a surface;
   b) rotating the substrate about a rotational axis;
   c) flowing a liquid from a liquid source through a first sonic energy source to apply a first some energy having a first power level to the liquid, thereby convening the liquid into a sonic treated liquid;
   d) positioning a vibration transmitter so that at least a portion of the vibration transmitter is adjacent the surface of the substrate, the vibration transmitter acoustically coupled to a second sonic energy source;
   e) applying the sonic-treated liquid to the surface of the substrate so as to form a film of the sonic-treated liquid on the surface of the substrate that couples the portion of the transmitter to the surface of the substrate; and
   f) applying second sonic energy, generated by the second sonic energy source and having a second power level, from the vibration transmitter through the sonic-treated liquid and to the surface of the substrate;
   wherein the first power level is greater than the second power level; and
   wherein the first sonic energy does not contact the surface of the substrate.

2. The method of claim 1 wherein the first sonic energy applied by the first sonic energy source has a different frequency than the second sonic energy applied by the second sonic energy source.

3. The method of claim 1 wherein step c) comprises applying the first sonic energy via the first sonic energy source to the liquid so as to cavitate the liquid.

4. The method of claim 1 wherein step c) comprises applying the first sonic energy via the first sonic energy source to the liquid so as to achieve a desired bubble size in the liquid.

5. The method of claim 1 further comprising:
applying an untreated liquid to the surface of the substrate so as to form a layer of the untreated liquid on the surface of the substrate, the vibration transmitter being in contact with the layer of the untreated liquid; and
wherein the sonic-treated liquid is supplied to the surface of the substrate at or near the vibration transmitter.

6. The method of claim 1 wherein step a) comprises supporting the substrate in a substantially horizontal orientation.

7. The method of claim 6 wherein step b) comprises rotating the substrate while maintaining the substantially horizontal orientation.

8. The method of claim 5 wherein the sonic-treated liquid is supplied to the surface of the substrate at a location that is within 90 circumferential degrees of the vibration transmitter.

9. The method of claim 1 wherein the surface of the substrate is a device side of the substrate.

10. The method of claim 1 wherein the substrate is a semiconductor wafer and the surface has technology nodes having a width of 100 nanometers or less.

11. The method of claim 10 wherein step a) comprises supporting the substrate in a substantially horizontal orientation so that the surface is facing the vibration transmitter.

12. The method of claim 1 wherein the first power level is greater than 50 Watts/cm$^2$ and the second power level is between 0.5 and 10 Watts/cm$^2$.

13. A method of processing a semiconductor wafer comprising:
a) supporting a semiconductor wafer having a surface, the surface having technology nodes having a width of 100 nanometers or less;
b) rotating the semiconductor wafer about a rotational axis;
c) flowing a liquid from a liquid source through a first sonic energy source to apply a first sonic energy generated by the first sonic energy source to the liquid, thereby converting the liquid into a sonic-treated liquid;
d) positioning a vibration transmitter so that at least a portion of the vibration transmitter is adjacent the surface of the semiconductor wafer, the vibration transmitter acoustically coupled to a second sonic energy source;
e) applying the sonic-treated liquid to the surface of the semiconductor wafer so as to form a film of the sonic-treated liquid on the surface of the semiconductor wafer that couples the portion of the transmitter to the surface of the semiconductor wafer; and
f) applying second sonic energy, generated by the second sonic energy source, from the transmitter through the sonic-treated liquid and to the surface of the semiconductor wafer;
wherein the first sonic energy does not contact the semiconductor wafer.

14. The method of claim 13 wherein the first sonic energy has a first power level and the second sonic energy has a second power level, the first power level being greater than the second power level.

15. The method of claim 14 wherein the first power level is greater than 50 Watts/cm$^2$ and the second power level is between 0.5 and 10 Watts/cm$^2$.

16. A method of processing a substrate comprising:
a) supporting a substrate having a surface;
b) rotating the substrate about a rotational axis;
c) flowing a liquid front a liquid, source through a first sonic energy source to apply a first sonic energy to the liquid, thereby converting the liquid into a sonic-treated liquid;
d) positioning a vibration transmitter so that at least a portion of the vibration transmitter is adjacent the surface of the substrate, the vibration transmitter acoustically coupled to a second sonic energy source;
e) applying the sonic-treated liquid to the surface of the substrate so as to form a film of the sonic-treated liquid on the surface of the substrate that couples the portion of the transmitter to the surface of the substrate; and
f) applying second sonic energy generated by the second sonic energy source from the vibration transmitter through the sonic-treated liquid, and to the surface of the substrate;
wherein the first sonic energy does not contact the substrate.

* * * * *